(12) United States Patent
Lee et al.

(10) Patent No.: US 10,177,779 B2
(45) Date of Patent: Jan. 8, 2019

(54) CHOPPER STABILIZED COMPARATOR FOR SUCCESSIVE APPROXIMATION REGISTER ANALOG TO DIGITAL CONVERTER

(71) Applicant: Avnera Corporation, Beaverton, OR (US)

(72) Inventors: Wai Lee, Portland, OR (US); Garry N. Link, Pacific City, OR (US); Jianping Wen, Tigard, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

(21) Appl. No.: 15/849,227

(22) Filed: Dec. 20, 2017

(65) Prior Publication Data

US 2018/0183456 A1 Jun. 28, 2018

Related U.S. Application Data

(60) Provisional application No. 62/438,922, filed on Dec. 23, 2016.

(51) Int. Cl.
*H03M 1/12* (2006.01)
*H03M 1/46* (2006.01)
*H03M 1/44* (2006.01)
*H03M 1/06* (2006.01)
*H03M 1/08* (2006.01)

(52) U.S. Cl.
CPC ......... *H03M 1/462* (2013.01); *H03M 1/0626* (2013.01); *H03M 1/08* (2013.01); *H03M 1/442* (2013.01); *H03M 1/466* (2013.01)

(58) Field of Classification Search
CPC ...... H03M 1/468; H03M 1/12; H03M 1/1023; H03M 1/1009; H03M 1/124; H03M 1/1245; H03M 1/00; H03M 1/002; H03M 1/442
USPC .......................... 341/118, 120, 143, 155, 172
See application file for complete search history.

(56) References Cited

U.S. PATENT DOCUMENTS

| 5,661,483 | A  | * | 8/1997 | Negahban | ............... | H03M 1/46 341/156 |
|---|---|---|---|---|---|---|
| 6,154,151 | A  | * | 11/2000 | McElreath | ............. | G01C 23/00 340/961 |
| 9,356,615 | B1 | * | 5/2016 | Ranjbar | ................... | H03M 1/38 |
| 9,413,383 | B1 | * | 8/2016 | Sharma | ................. | H03M 3/384 |
| 9,520,891 | B1 | * | 12/2016 | Kull | ......................... | H03M 1/08 |
| 9,559,716 | B1 | * | 1/2017 | Matsui | ..................... | H03M 1/46 |
| 9,571,114 | B1 | * | 2/2017 | Shen | ................... | H03M 1/0612 |
| 9,577,663 | B1 | * | 2/2017 | Paton Alvarez | ...... | H03M 3/464 |
| 2010/0289682 | A1 | * | 11/2010 | Groenewold | ........... | H03M 3/34 341/143 |

(Continued)

*Primary Examiner* — Linh Nguyen
(74) *Attorney, Agent, or Firm* — Miller Nash Graham & Dunn LLP (57) ABSTRACT

The disclosure includes an analog to digital converter (ADC). The ADC includes a comparator to compare sample values of an analog signal in an analog domain to reference values to determine digital values in a digital domain. The digital values correspond to the analog signal and may be determined according to successive approximation. The ADC also includes chop switches to modulate the analog signal to increase a frequency of flicker noise in the analog domain. The ADC also includes an un-chop switch to demodulate the digital values in the digital domain prior filtration of the flicker noise by a digital filter.

20 Claims, 5 Drawing Sheets

(56) References Cited

U.S. PATENT DOCUMENTS

| | | | |
|---|---|---|---|
| 2011/0200070 A1* | 8/2011 | Makinwa | G01K 1/024 374/170 |
| 2012/0112937 A1* | 5/2012 | Yamase | H03M 1/462 341/110 |
| 2012/0239350 A1* | 9/2012 | Motz | G01R 33/0029 702/190 |
| 2012/0306679 A1* | 12/2012 | Zhu | H03M 1/002 341/155 |
| 2013/0021018 A1* | 1/2013 | Venkataraman | H03M 1/1295 324/123 R |
| 2013/0033392 A1* | 2/2013 | Nani | H03M 1/08 341/166 |
| 2014/0167991 A1* | 6/2014 | Oshita | H03M 3/458 341/143 |

* cited by examiner

CHOPPER STABILIZED COMPARATOR FOR SUCCESSIVE APPROXIMATION REGISTER ANALOG TO DIGITAL CONVERTER

CROSS-REFERENCES TO RELATED APPLICATIONS

The present application claims benefit from U.S. Provisional Patent Application Ser. No. 62/438,922, filed Dec. 23, 2016, and entitled "Audio Successive Approximation Register ADC Having Chopper Stabilized Comparator," which is incorporated herein by reference as if reproduced in its entirety.

BACKGROUND

Flicker noise is potentially a problem when operating any electronic component at low frequencies. Complementary Metal Oxide Semiconductor (CMOS) based devices may experience particularly high flicker noise. Flicker noise may occur when electrons become temporarily trapped in imperfections in a conductive material. Such trapped electrons may move through the conductor in a random walk pattern that is unpredictable, which results in unpredictable noise. Flicker noise can be described mathematically as occurring as an inverse of a signal frequency. As such, flicker noise is sometimes referred to as 1/f noise, where f is a corresponding signal frequency. Accordingly, flicker noise becomes a trivial concern at high frequencies. However, flicker noise can dominate other noise mechanisms when operating at low frequencies. For example, flicker noise may be a significant concern when operating CMOS based analog to digital converters (ADCs). Flicker noise may be an even greater concern when such an ADC is employed to convert audio signals, as such audio signals occur at low frequencies (e.g. approximately twenty hertz (Hz) to approximately twenty kilohertz (kHz). Flicker noise in CMOS is related to the size of the gate area, and can be reduces by increasing the size of the device. However, increasing gate size solely to decrease flicker noise is impractical as smaller device sizes are generally preferred in CMOS designs.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Disclosed herein is a SAR ADC that employs both chopper switches and an un-chop switch. A SAR core sequencer may control both the chopper switches and the un-chop switch. The chopper switches modulate the signal to increase the frequency of the flicker noise to a frequency outside the band of interest (e.g. outside the audio band). A digital signal processor (DSP) may then filter the flicker noise out of the digital signal, for example by employing a bandpass filter. For example, the chopper switches may invert an incoming analog signal in the analog domain. A comparator may then be employed to convert the analog signal into a digital signal according to a SAR process. The un-chop switch may then be employed to invert the signal in the digital domain to correct for the inversion in the analog domain (e.g. maintain consistent polarity). In some embodiments, the chop switches may be positioned between a sampling capacitor array and the comparator. In another example, the chop switches may be positioned at an input to the sampling capacitor array. In another example, the un-chop switch may be implemented in a SAR register. In yet another example, the un-chop switch may be implemented between a correction circuit and the DSP.

Figure 1:
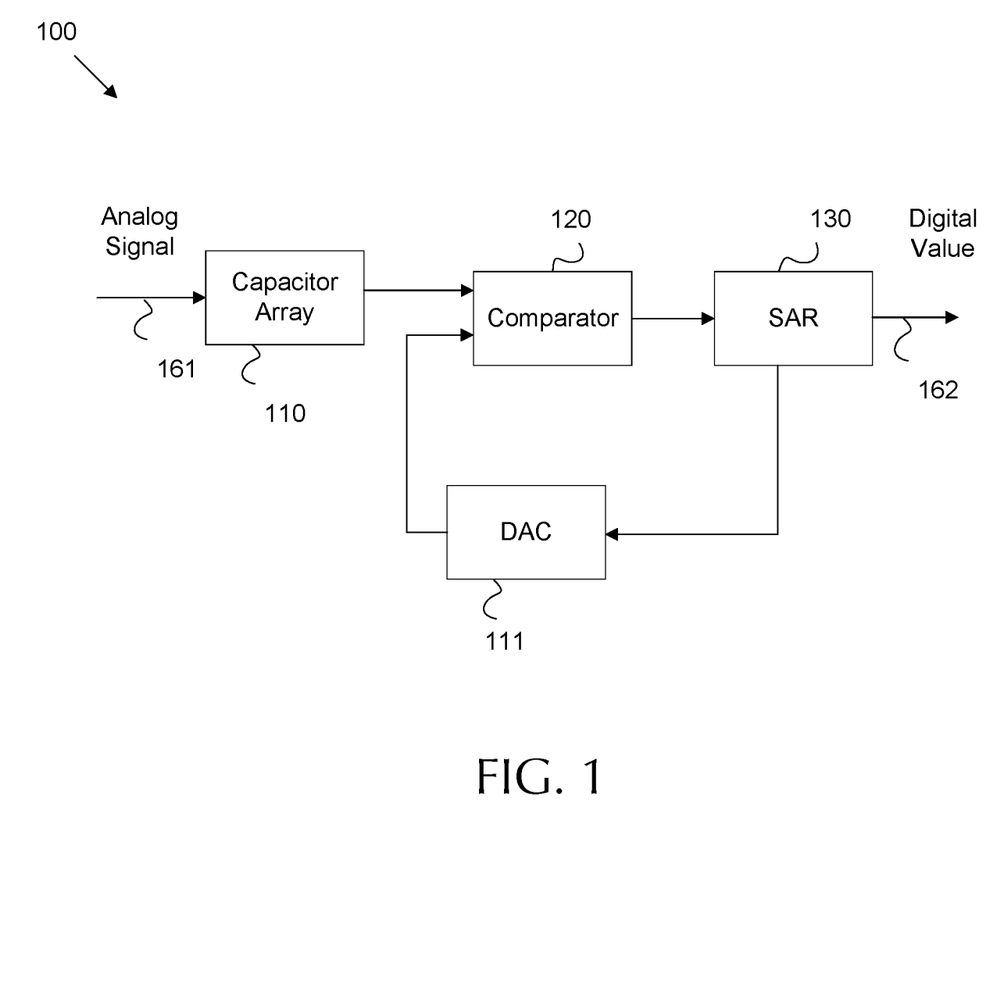
FIG. 1 is a schematic diagram of an example Successive Approximation Register (SAR) ADC architecture.

FIG. 1 is a schematic diagram of an example SAR ADC 100 architecture. The SAR ADC 100 includes a capacitor array 110, a comparator 120, a SAR 130, and a Digital to Analog Converter (DAC) 111 coupled as illustrated. The capacitor array 110 is coupled to an incoming analog signal 161. The capacitor array 110 includes a plurality of capacitors of varying levels of capacitance. The capacitors store charge from the analog signal 161 as a sample of the analog signal at a discrete instance in time. The SAR 130 may include a register for storing digital data as well as a circuit for providing known reference values. The DAC 111 is any device capable of converting a digital value to a corresponding analog signal value. The SAR 130 is configured to forward a known reference value (e.g. a one) via the DAC 111 to the comparator 120 for each bit of the sample. The comparator 120 is any electronic device capable of comparing two voltages and outputting an indication of which voltage is larger. The comparator 120 receives both voltage from the sample in the capacitor array 110 and the known value from the SAR 130 via the DAC 111. The comparator 120 then indicates which value is larger. The result of the comparison is stored in the SAR 130 as a bit of a corresponding digital value 162.

As such, the capacitor array 110 may include a capacitor/capacitor group for storing a portion of the analog signal for each bit desired in the digital value 162. The SAR ADC 100 may then iteratively test the electrical charge from each group of capacitors in the capacitor array 110 against the known value from the SAR 130 on a bit by bit basis. The results are stored in the SAR 130. Once all the desired bits have been tested, the resulting digital value 162 may be forwarded from the SAR ADC 100 for further use by coupled systems, for example at a DSP. The SAR ADC 100 provides accurate values so long as the capacitors in the capacitor array 110 include an expected capacitance. However, due to manufacturing variation, the capacitance of the capacitor array 110 may vary significantly from device to device. As such, various calibration techniques are discussed below to account for such variation. Such calibration allows the SAR ADC 100 to employ significantly reduced precision components, which in turn allows for the use of lower power components while maintaining accuracy and hence maintaining high SNR.

While an SAR ADC 100 may be implemented in many different fashions, it should be noted that the capacitor array 110 and the DAC 111 may be implemented in a common capacitor network. Further, the comparator 120 may contain one or more preamplifier stages that can be configured as a sampling Operational Transconductance Amplifier (OTA). Further, the comparator 120 can be configured as the only active component of the analog circuitry of SAR ADC 100.

This supports creation of a low power and high precision design. While the reference accuracy of the DAC 111 may limit the resolution the SAR ADC 100 can achieve, digital calibration can be employed to calibrate the capacitor array 110 and mitigate such concerns.

It should also be noted that the SAR ADC 100 architecture may be implemented in CMOS. Further, when the analog signal 161 is an audio signal, the SAR ADC 100 architecture may be employed for audio processing. In such a case, flicker noise may occur across the comparator 120. As such, chop switches may be positioned on the analog side of the comparator to modulate the analog signal 161 and corresponding flicker noise. This may increase the frequency of the flicker noise and place the flicker noise outside of the audio band. Hence, the flicker noise may be filtered out during digital processing. Un-chop switches may be placed on the digital side of the comparator 120. The un-chop switches may selectively invert the bits of the digital values 162 so that the digital values 162 maintain a consistent polarity despite the chopping. Hence, the chopping and un-chopping may be transparent to the other signal components. As an example, the chop switches may invert the analog signal 161 values before to the SAR ADC 100 takes a sample at the capacitor array 110. The un-chop may simultaneously invert the digital value 162 during the SAR process for the sample. The chop switches and un-chop switches may then be inverted when another sample is taken for a next digital value 162. In some cases, the chopping/un-chopping polarity may only be switched between a few digital values 162 (e.g. every third value, every fourth value, etc.) as desired. This is because high frequency modulation may not be required to place the flicker noise outside of the audio band (e.g. as the audio band is relatively low frequency).

Figure 2:
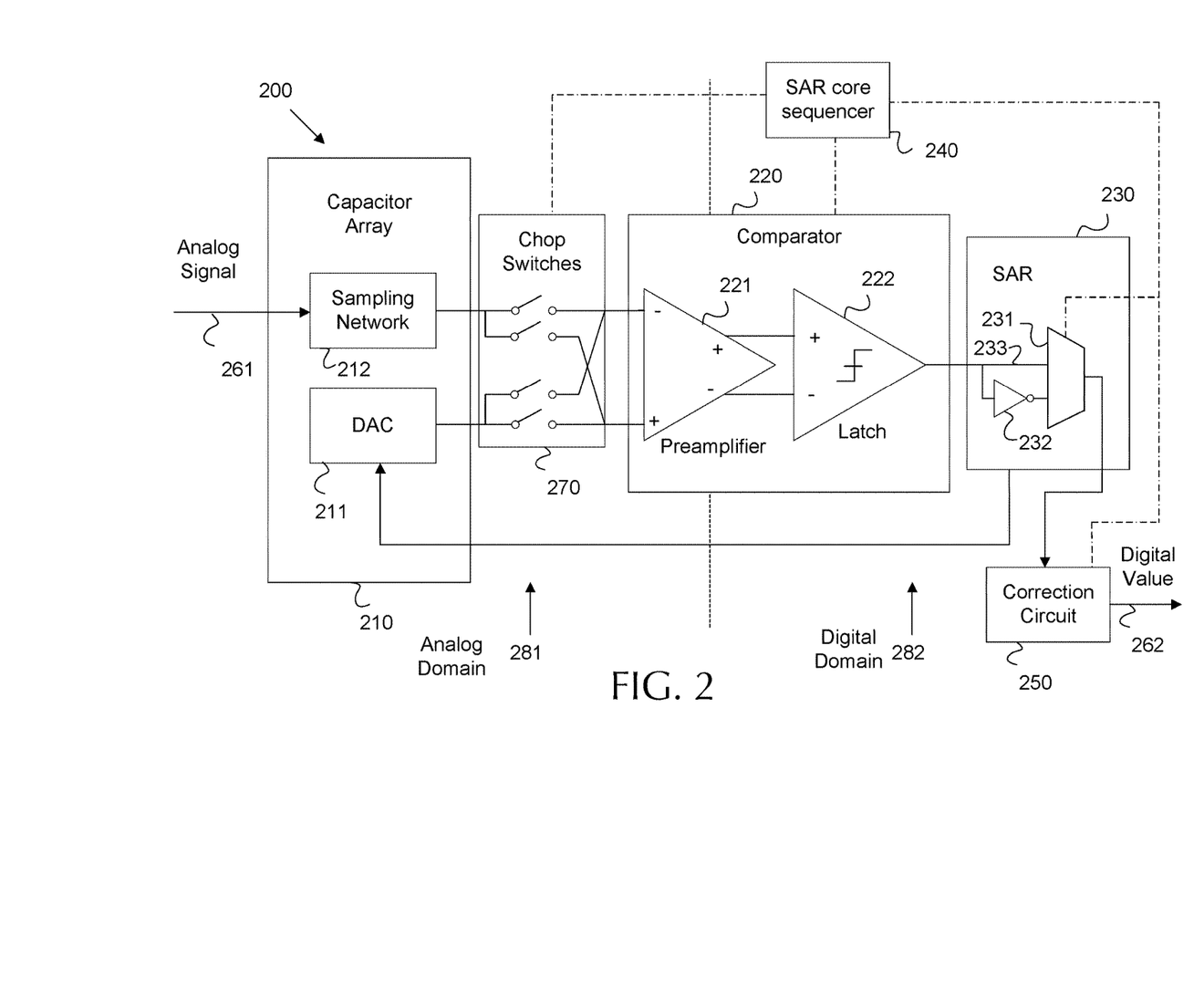
FIG. 2 is a schematic diagram of an example SAR ADC with a chopper stabilized comparator.

FIG. 2 is a schematic diagram of an example SAR ADC 200 with a chopper stabilized comparator 220, which may be employed to implement a SAR ADC architecture, such as SAR ADC 100 architecture. The SAR ADC 200 includes a capacitor array 210, a comparator 220, a SAR 230, and a DAC 211, which may be substantially similar to capacitor array 110, comparator 120, SAR 130, and DAC 111, respectively. The SAR ADC 200 receives an analog signal 261 and generates digital values 262, which are substantially similar to the analog signal 161 and digital value 162, respectively.

The analog signal 261, may be any continuous electrical. In some examples, the analog signal contains audio data in a frequency band between about twenty Hz and about twenty kHz. As a specific example, the audio signal 261 may audio recorded by one or more microphones during an active noise cancelation process employed in a headphone set. As another specific example, the analog signal 261 may be an audio signal employed as part of a BLUETOOTH speaker. The analog signal 261 may be received at the capacitor array 210. The capacitor array 210 includes a sampling network 212 of capacitors to store sample values. For example, the analog signal 261 may charge the capacitors of the sampling network during a SAR ADC 200 sampling phase. At the end of the sampling phase, the analog signal 261 is disconnected from the sampling network 212. As such, at the end of the sampling phase, the sampling network 212 of capacitors contains an amount of charge corresponding to a value of the analog signal 261 (e.g. which may be described in terms of amplitude, current, voltage, etc.) at a discrete instant in time. The SAR ADC 200 may then enter a SAR phase to successively approximate the sample value stored in the sampling network as a digital value 262. The SAR ADC 200 may then return to a sample phase to obtain a next sample from the analog signal 261, etc. The capacitor array 210 may also include the DAC 210, which provides reference values from the SAR 230 that are employed to successively approximate the digital values 262.

The SAR ADC 200 also includes the comparator 220 to compare sample values of the analog signal 261 in an analog domain 281 to reference values from the DAC 211 to determine digital values 262 in a digital domain 282. Hence, the digital values 262 correspond to values of the analog signal 261. Components operating on the input side of the comparator 220 can be considered to operate according to analog signal processing principles and hence such components make up the analog domain 281. Components operating on the output side of the comparator 220 can be considered to operate according to digital signal processing principles and hence such components make up the digital domain 281. The analog domain 281 and the digital domain 282 are depicted as being divided by a dashed line. While the DAC 211 is depicted in the analog domain 281 for visual simplicity, it should be noted that the DAC 211 also acts as a dividing component between the analog domain 281 and the digital domain 282.

The comparator 200 contains a preamplifier 221 and a latch 222. The a preamplifier 221 may be any electronic device that increases the power of a weak electrical signal to create a signal of sufficient strength for further processing. The latch 222 is any circuit with two stable states, which can be employed to store information. Specifically, the preamplifier 221 amplifies a sample from the sampling network 212 as well as a reference value from the SAR 230 via the DAC 211. The comparator 220 compares the two values and initiates the latch 222 to output an indication of which value is greater (or lesser depending on implementation).

The SAR 230 stores digital value bits during determination of the digital values 262. Specifically, the SAR 230 may store the results of each comparison by the comparator 220 as a bit in a register and provide a reference value to be employed to determine a next bit. Once a desired number of bits have been tested and stored, an approximate digital value 262 has been generated that corresponds to the analog signal 261 sample value obtained during the sampling phase. The SAR ADC 200 may then reenter the sampling phase and obtain another sample value of the analog signal at the sampling network.

As noted above, the digital values 262 stored in the SAR 230 may be approximate. For example, capacitors may vary in capacitance due to variations in manufacturing processes. As such, the capacitors in the sampling network 212 and/or the DAC 211 may be measured during a calibration process. For example, known input values may be forwarded to the capacitor array 210 for testing purposes during a calibration process (e.g. on startup, on system update, on command by user, etc.) The calibration process results in various capacitor weights that are stored in a correction circuit 250. The correction circuit 250 is a circuit configured to store the capacitor weights, for example in a lookup table, and apply such weights to approximate digital values 262 to arrive at final digital values 262. Hence, the correction circuit 250 is configured to correct the digital values 262 based on sampling capacitor weights. Once the weights have been applied, the digital value 262 has been corrected for any capacitor variance in the capacitor array.

The SAR ADC 200 also include a SAR core sequencer 240. The SAR core 240 may be a control circuit configured to control the components of SAR ADC 200 in order to enact sampling, successive approximation, and/or calibration. For example, the SAR core sequencer 240 may manage a duty cycle for the SAR ADC 200 by sending command pulses to the SAR ADC 200 components for clock cycles according to a finite state machine. The SAR core 240 may be implemented as any form of control processor, for example as an Application Specific Integrated Circuit (ASIC), a Field Programmable Gate Array (FPGA), a Digital Signal Processor (DSP), a general purpose processor, and/or any other control circuit. The SAR core 240 is depicted as connecting to other components via a line with dots and dashes to indicate that such connects are for control purposes as opposed to solid lines for data processing (e.g. control plane vs data plane).

As discussed above, flicker noise may occur in SAR ADC 200, for example when SAR ADC 200 is implemented in CMOS and/or when SAR ADC 200 is employed to convert audio data in an analog signal 261 into audio data in a corresponding digital signal including digital values 262. Accordingly, the SAR ADC 200 includes one or more chop switches 270 to modulate the analog signal 261 to increase the frequency of the flicker noise in the analog domain 281. The SAR ADC 200 also includes an un-chop switch 231 to demodulate the digital values 262 in the digital domain 282.

The chop switches 270 may be implemented as a plurality of switches that selectively invert the comparator 220 inputs based on commands from the SAR core sequencer 240. For example, the chop switches 270 may swap the output from the sampling network 212 and the output of the DAC 211 between the positive and negative inputs, respectively, to the preamplifier 221 of the comparator. This effectively inverts the bits of the digital value 262. In another example, the SAR ADC 200 may employ differential signals where the sampling network 212 and the DAC each transmit a value by communicating a signal pair. In such a case, the chop switches 270 may swap the inputs by swapping the polarity of the digital pairs. In either case, such swapping, which may be referred to as chopping, may also modulate the frequency noise. The more often the chop switches 270 swap the input, the high the frequency of the modulated flicker noise. The chop switches 270 may chop the analog signal 261 samples at a rate sufficient to raise the frequency of the flicker noise outside of the frequency band of interest. For example, chop switches 270 may increase the frequency of the flicker noise to a value outside of the audio band so that the flicker noise can be filtered out by a frequency specific filter, such as a bandpass filter set to the audio band. In SAR ADC 200, the chop switches 270 that modulate the analog signal 261 are coupled between an output of the capacitor array 210 and an input to the comparator 220 as shown in FIG. 2. The chop switches 270 may swap inputs before/after a sampling phase is complete for each new sample, before/after every other sampling phase, before/after every third sampling phase, etc. The chop switches 270 may remain in a constant position during the SAR phase to maintain consistent polarity between successive bits. Chopping between each ADC conversion may result in a chopping frequency that is half of the ADC conversion rate. Chopping between an integer number of conversions may result in chopping frequency that is an integer division of the of the ADC conversion rate. A lower integer division chopping frequency may minimize artifacts produced by the chopping process, and may be employed so long as the resultant chopping frequency is sufficient to move the flicker noise out of the band of interest (e.g. the audio band). For example, the ADC conversion rate employed may be about 1.024 megahertz (MHz), and the corresponding chopping frequency employed may be 256 kHz.

The un-chop switch 231 may be implemented in the SAR 230. For example, the un-chop switch 231 may be implemented as a multiplexer coupled to an input line 233 and an inverted line 231. The inverted line 232 may contain the inverse of data on the input line 233. The un-chop switch may demodulate the digital values 262 by switching an output between the input line 233 and the inverted line 232. By selectively inverting the digital values 262 when the chop switches 270 are swapped, the chop switch 231 may ensure the digital values 262 maintain a consistent polarity. Accordingly, the chopping and un-chopping may be performed transparently to the other components, and the data in the digital values 262 may not be affected. In other words, the un-chop switch 231 in the digital domain 282 may correct for the inversion caused by the chop switches 270 in the analog domain. Further, the SAR core sequencer 240 may control both the chop switches 270 and the un-chop switch 231. Hence, the SAR core sequencer may control the chop switches 270 and the un-chop switch 231 to align modulation in the analog domain 281 to demodulation in the digital domain 282 to maintain a consistent polarity of the digital values 262.

Figure 3:
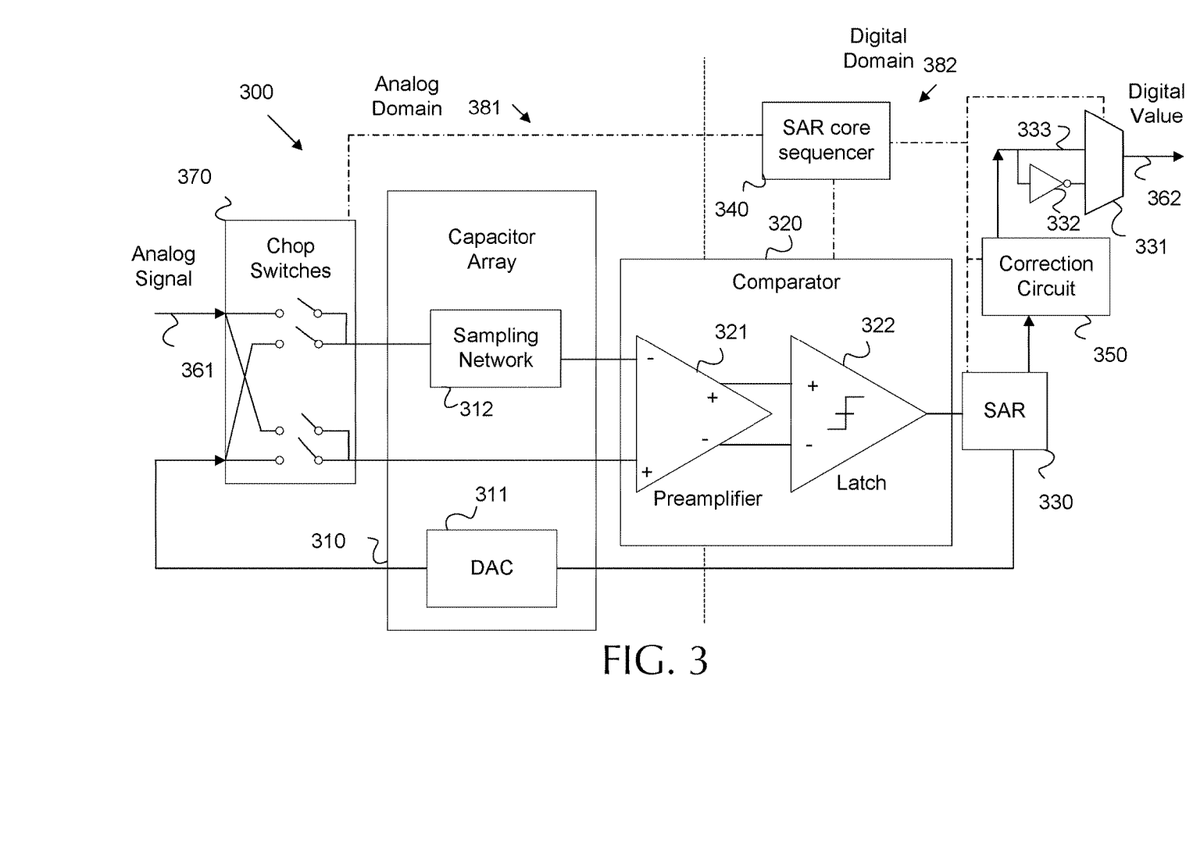
FIG. 3 is a schematic diagram of another example SAR ADC with a chopper stabilized comparator.

FIG. 3 is a schematic diagram of another example SAR ADC 300 with a chopper stabilized comparator, which may be employed to implement a SAR ADC architecture, such as SAR ADC 100 architecture. SAR ADC 300 may be substantially similar to SAR ADC 200, but employs chop switches 370 and an un-chop switch 331 at different locations. SAR ADC 300 includes chop switches 370, a capacitor array 310 with a sampling network 312 and a DAC 311, a comparator 320 with a preamplifier 321 and a latch 322, a SAR core sequencer 340, a SAR 330, a correction circuit 350, and an un-chop switch 331, which may be substantially similar to chop switches 270, capacitor array 210, sampling network 212, DAC 211, comparator 220, preamplifier 221, latch 222, SAR core sequencer 240, SAR 230, correction circuit 250, and un-chop switch 231, respectively. The SAR ADC 300 converts an analog signal 361 in the analog domain 381 into digital values 362 in a digital domain 382, which are similar to the analog signal 261, the analog domain 281, the digital values 262, and the digital domain 282, respectively. Further, the un-chop switch 331 is coupled to an input line 333 and an inverted line 331, which are substantially similar to the input line 233 and the inverted line 231, respectively.

Unlike SAR ADC 200, the SAR ADC 300 chop switches 370 that modulate the analog signal 361 are coupled to an input of the capacitor array 310. Hence, the chop switches 370 operate directly on the analog signal 361 and/or the reference value from the DAC 311 instead of operating on the analog signal 631 samples. Further, the un-chop switch 331 and associated input line 333 and inverted line 332 are coupled to the output of the correction circuit 350. The SAR ADC 200 also includes a DSP to process the digital values, as discussed below. Accordingly, the un-chop switch 331 that demodulates the digital values 362 is coupled between the correction circuit 350 and the DSP. The chop switches 370 and the un-chop switch 331 increase the frequency of flicker noise while maintaining a consistent digital value 362 polarity in a manner substantially similar to chop switches 270 and un-chop switch 231 as described above with respect to FIG. 2. Also, SAR core sequencer 340 may control the chop switches 370 and the un-chop switch 331 to maintain consistent polarity as discussed above. For example, the SAR core sequencer 340 may transmit a chop clock signal to select between the true or negative (e.g. input line 333 and inverted line 331) of the correction circuit 350 output word.

Figure 4:
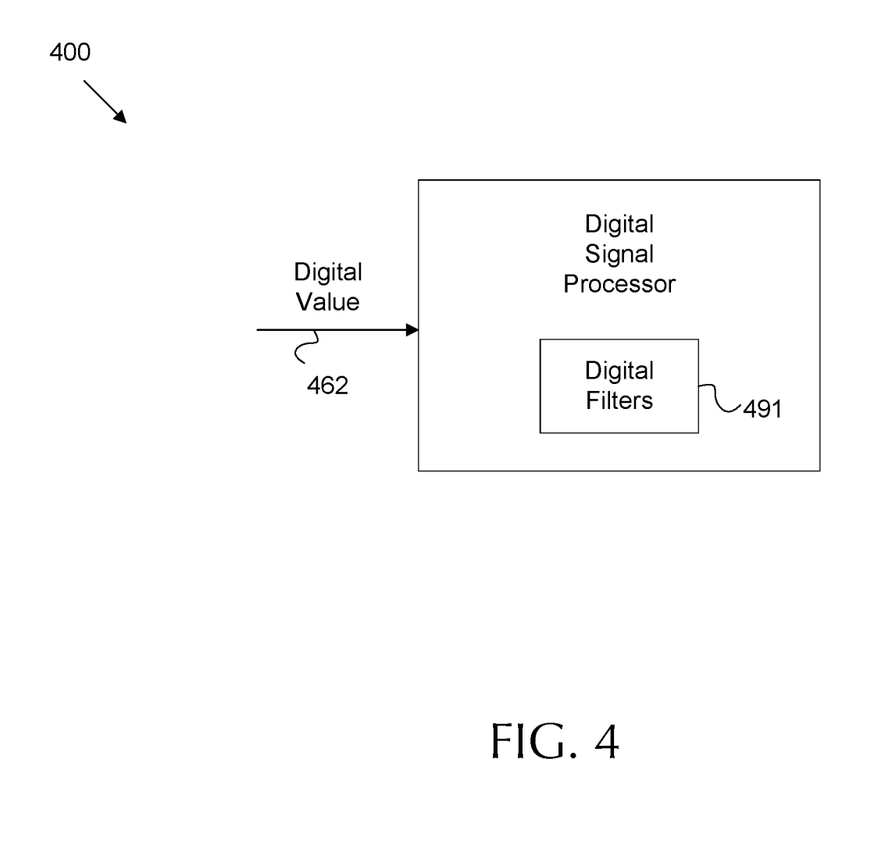
FIG. 4 is a schematic diagram of an example digital signal processor (DSP) to remove modulated flicker noise.

FIG. 4 is a schematic diagram of an example digital signal processor (DSP) 400 to remove modulated flicker noise. A DSP 400 is a specialized microprocessor with an architecture optimized for digital signal processing. The DSP 400 may receive digital values 462 from an ADC core or multiple parallel cores as part of a digital stream. As such, digital values 462 may be substantially similar to digital values 162, 262, and/or 362. The digital values 462 may contain accurate digital values corresponding to analog signal samples. The digital values 462 may also contain flicker noise modulated by chopping as discussed above. The flicker noise is has been modulated to a frequency in excess of the frequency of interest. For example, the modulated flicker noise may occur at a higher frequency that is outside the audio band. As a specific example, the modulated flicker noise may occur at a frequency above about twenty kHz. The DSP 400 may include digital filters 491 that filter the digital values 462 based on frequency. For example, the digital filters 491 may include a bandpass filter with a low frequency bounds set to about twenty Hz and a high frequency bounds set to about twenty kHz. As such, the digital filters 491 may filter out the flicker noise without affecting the underlying data in the digital values 462. Accordingly, the ADC may include a DSP 400 to apply a digital filter 491 to filter out the flicker noise by filtering out data associated with the increased flicker noise frequency.

Figure 5:
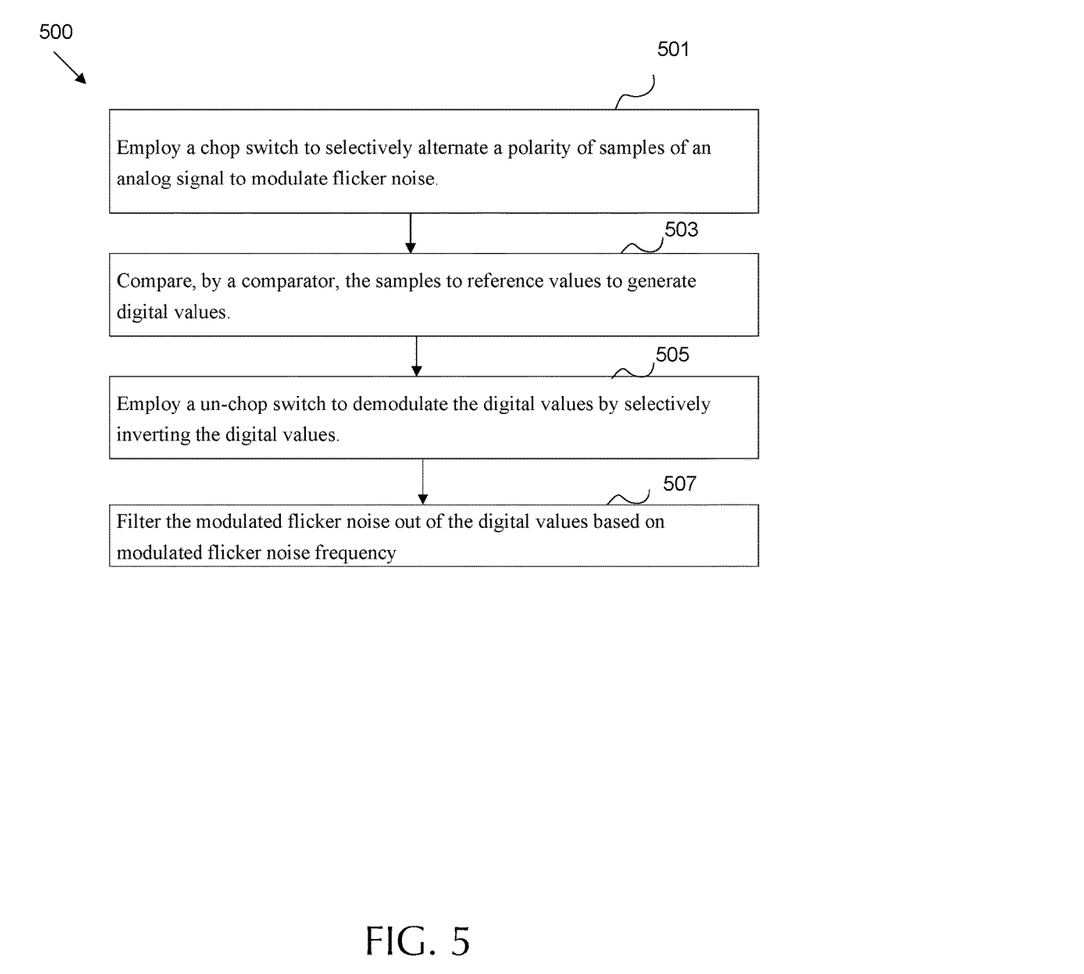
FIG. 5 is a flowchart of an example method of operating a SAR ADC with a chopper stabilized comparator.

FIG. 5 is a flowchart of an example method 500 of operating a SAR ADC with a chopper stabilized comparator, such as SAR ADC 200 and/or 300 with a DSP 400. For example, the method 500 may be implemented by a SAR core sequencer, such as SAR core sequencer 240 and/or 340.

At block 501, a chop switch is employed to selectively alternate a polarity of samples of an analog signal to modulate flicker noise. As noted above, the polarity of sampled analog signal or the polarity of the analog signal prior to sampling may be alternated depending on the embodiment. Such polarity alternation may include swapping a connection between the analog signal and a comparator with a connection between a reference signal and the comparator, and vice versa. Such a polarity alteration may also be achieved in a differential signal system by alternating the polarity of each differential signal pair (e.g. alternating a differential pair for the analog signal and a differential pair for the reference signal). Depending on the example, the polarity of the samples may be alternated between sampling and comparison by a comparator, as performed by chop switches 270 in SAR ADC 200. In other examples, the polarity of the samples are alternated by alternating a polarity of the analog signal prior to sampling by a capacitor array, as performed by chop switches 370 in SAR ADC 300.

At block 503, a comparator in the SAR based ADC is employed to compare the analog signal samples to reference values to generate digital values. Such digital values may be determined according to successive approximation, by successively testing the analog signal verses various reference values to measure the digital signal to a desired number of bits.

At block 505, an un-chop switch is employed to demodulate the digital values by selectively inverting the digital values. As noted above, the digital values are selectively inverted/demodulated to cause the digital values to maintain a constant polarity regardless of the position of the chop switches and un-chop switch(es). This allows the chopping to occur in a manner than is transparent to, and can be ignored by, other components in the system. Depending on the example, the digital values may be selectively inverted in a SAR register, as performed by SAR 230 in SAR ADC 200. In other example, the digital values are selectively inverted between correction by correction circuit and processing by a DSP, as performed by un-chop switch 331 in SAR ADC 300.

At block 507, the modulated flicker noise is filtered out of the digital values based on modulated flicker noise frequency. For example, when the analog signal includes audio data, the polarity of the analog samples may be selectively alternated to increase a frequency of the flicker noise to a value outside an audio band. A bandpass filter in a DSP may then filter out the flicker noise along with all other noise outside of the audio band.

Another mechanism, called auto-zero, may be employed to reduce flicker noise. Auto-zero may employ a comparator amplifier to drive a sampling capacitor during a sampling phase, which causes flicker noise to be sampled in the sampling capacitor. The sampled flicker noise then cancels flicker noise during the SAR phase. The disclosed chopper stabilized comparator system for SAR ADC may have many advantages over other flicker reduction and offset voltage reduction mechanisms, such as auto-zero. For example, the implementation disclosed herein may be simpler than other approaches and may only require the addition of some switches, logic gates, and a controlling mechanism (e.g. SAR core sequencer) to generate a chop clock. This is vastly simpler to implement than an auto-zero amplifier. Further, during input sampling, no auto-zero amplifier, which consumes power, is needed. Hence, the disclosed mechanisms have a power consumption advantage over an auto-zero system. In addition, some chopper stabilization systems may employ both chop and un-chop switches in the analog domain. The disclosed methods/devices may utilize chop switches in the analog domain with the un-chop operation operating in the digital domain. Hence, the present disclosure extends the chopping concept across mixed-signal domains. Also, the present disclosure applies to applications where the band of interest is less than the Nyquist bandwidth of the ADC. This is useful since the flicker noise is moved to a frequency for removal by subsequent digital filtering. Hence the disclosed mechanisms are particularly relevant to audio analog to digital converters where the ADC conversion rate is many times higher than the 20 kHz audio band. Further, the disclosure applies directly to a SAR ADC architecture where the comparator is a dominant noise source. The disclosure provides an approach to minimize comparator flicker noise with minimal additional circuitry and complexity. Finally, excluding an auto-zero amplifier circuitry, allows the disclosed systems to reduce the die area of the circuit which reduces integrated circuitry production costs.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

EXAMPLES

Illustrative examples of the technologies disclosed herein are provided below. An embodiment of the technologies may include any one or more, and any combination of, the examples described below.

Example 1 includes an analog to digital converter (ADC) comprising: a comparator to compare sample values of an analog signal in an analog domain to reference values to determine digital values in a digital domain, the digital values corresponding to the analog signal; one or more chop switches to modulate the analog signal to increase a frequency of flicker noise in the analog domain; and an un-chop switch to demodulate the digital values in the digital domain.

Example 2 includes the ADC of Example 1, further comprising a successive approximation register (SAR) to store digital value bits during determination of the digital values, wherein the un-chop switch is implemented in the SAR.

Example 3 includes the ADC of Example 1, further comprising: a correction circuit to correct the digital values based on sampling capacitor weights; and a digital signal processor (DSP) to process the digital values, wherein the un-chop switch to demodulate the digital values is coupled between the correction circuit and the DSP.

Example 4 includes the ADC of Examples 1-3, wherein the un-chop switch is a multiplexer coupled to an input line and an inverted line, the un-chop switch demodulating the digital values by switching an output between the input line and the inverted line.

Example 5 includes the ADC of Examples 1-4, further comprising a successive approximation register (SAR) core sequencer to control the chop switches and the un-chop switch to align modulation in the analog domain to demodulation in the digital domain to maintain consistent polarity.

Example 6 includes the ADC of Examples 1-5, further comprising a capacitor array to store the sample values, wherein the chop switches to modulate the analog signal are coupled to an input of the capacitor array.

Example 7 includes the ADC of Examples 1-5, further comprising a capacitor array to store the sample values, wherein the chop switches to modulate the analog signal are coupled between an output of the capacitor array and an input to the comparator.

Example 8 includes the ADC of Examples 1-7, wherein the chop switches increase the frequency of the flicker noise to a value outside an audio frequency band.

Example 9 includes the ADC of Examples 1-8, further comprising a digital signal processor to apply a digital filter to filter out the flicker noise by filtering out data associated with the increased flicker noise frequency.

Example 10 includes a method comprising: selectively alternating a polarity of samples of an analog signal to modulate flicker noise; comparing, by a comparator in a Successive Approximation Register (SAR) based Analog to Digital Converter (ADC), the samples to reference values to generate digital values; demodulating the digital values by selectively inverting the digital values; and filtering the modulated flicker noise out of the digital values based on modulated flicker noise frequency.

Example 11 includes the method of Example 10, wherein the polarity of the samples are selectively alternated to increase a frequency of the flicker noise to a value outside an audio band.

Example 12 includes the method of Examples 10-11, wherein the polarity of the samples are alternated between sampling and comparison by the comparator.

Example 13 includes the method of Examples 10-11, wherein the polarity of the samples are alternated by alternating a polarity of the analog signal prior to sampling by a capacitor array.

Example 14 includes the method of Examples 10-13, wherein the digital values are selectively inverted in a SAR register.

Example 154 includes the method of Examples 10-13, wherein the digital values are selectively inverted between correction by correction circuit and processing by a digital signal processor (DSP).

Example 16 includes an analog to digital converter (ADC) comprising: a Successive Approximation Register (SAR) core sequencer configured to: employ chop switches to selectively alternate a polarity of samples of an analog signal to modulate flicker noise prior to comparison to reference values by a SAR comparator to generate digital values; and employ an un-chop switch to demodulate the digital values by selectively inverting the digital values to support filtering of the modulated flicker noise out of the digital values based on modulated flicker noise frequency.

Example 17 includes the ADC of Example 16, wherein the polarity of the samples are alternated between sampling by a capacitor array and comparison by the comparator.

Example 18 includes the ADC of Example 16, wherein the polarity of the samples are alternated by alternating a polarity of the analog signal prior to sampling by a capacitor array.

Example 19 includes the ADC of Examples 16-18, wherein the digital values are selectively inverted controlling a SAR register containing the un-chop switch.

Example 20 includes the ADC of Examples 16-18, wherein the digital values are selectively inverted after correction by a correction circuit.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

What is claimed is:

1. An analog to digital converter (ADC) comprising:
a digital to analog converter (DAC) to output reference values;
a comparator having a positive input and a negative input to receive an analog signal in an analog domain and the reference values from the digital to analog converter and to compare sample values of the analog signal to the reference values to determine digital values in a digital domain, the digital values corresponding to the analog signal;
one or more chop switches to modulate the analog signal to increase a frequency of flicker noise in the analog domain by alternating the reference values and the analog signal between the positive input and the negative input; and
an un-chop switch to demodulate the digital values in the digital domain.

2. The ADC of claim 1, further comprising a successive approximation register (SAR) to store digital value bits during determination of the digital values, wherein the un-chop switch is implemented in the SAR.

3. The ADC of claim 1, further comprising:
a correction circuit to correct the digital values based on sampling capacitor weights; and
a digital signal processor (DSP) to process the digital values, wherein the un-chop switch to demodulate the digital values is coupled between the correction circuit and the DSP.

4. The ADC of claim 1, wherein the un-chop switch is a multiplexer coupled to an input line and an inverted line, the un-chop switch demodulating the digital values by switching an output between the input line and the inverted line.

5. The ADC of claim 1, further comprising a successive approximation register (SAR) core sequencer to control the chop switches and the un-chop switch to align modulation in the analog domain to demodulation in the digital domain to maintain consistent polarity.

6. The ADC of claim 1, further comprising a capacitor array to store the sample values, wherein the chop switches to modulate the analog signal are coupled to an input of the capacitor array.

7. The ADC of claim 1, further comprising a capacitor array to store the sample values, wherein the chop switches to modulate the analog signal are coupled between an output of the capacitor array and an input to the comparator.

8. The ADC of claim 1, wherein the chop switches increase the frequency of the flicker noise to a value outside an audio frequency band.

9. The ADC of claim 1, further comprising a digital signal processor to apply a digital filter to filter out the flicker noise by filtering out data associated with the increased flicker noise frequency.

10. A method comprising:
selectively alternating polarities of reference values from a digital to analog converter (DAC) and samples of an analog signal to modulate flicker noise;
comparing, by a comparator in a Successive Approximation Register (SAR) based Analog to Digital Converter (ADC), the samples to the reference values to generate digital values;
demodulating the digital values by selectively inverting the digital values; and
filtering the modulated flicker noise out of the digital values based on modulated flicker noise frequency.

11. The method of claim 10, wherein the polarity of the samples are selectively alternated to increase a frequency of the flicker noise to a value outside an audio band.

12. The method of claim 10, wherein the polarity of the samples are alternated between sampling and comparison by the comparator.

13. The method of claim 10, wherein the polarity of the samples are alternated by alternating a polarity of the analog signal prior to sampling by a capacitor array.

14. The method of claim 10, wherein the digital values are selectively inverted in a SAR register.

15. The method of claim 10, wherein the digital values are selectively inverted between correction by correction circuit and processing by a digital signal processor (DSP).

16. A analog to digital converter (ADC) comprising:
a Successive Approximation Register (SAR) core sequencer configured to:
employ chop switches to selectively alternate a polarity of samples of an analog signal and reference values from a digital to analog converter (DAC) to modulate flicker noise prior to comparison to the reference values by a SAR comparator to generate digital values; and
employ an un-chop switch to demodulate the digital values by selectively inverting the digital values to support filtering of the modulated flicker noise out of the digital values based on modulated flicker noise frequency.

17. The ADC of claim 16, wherein the polarity of the samples are alternated between sampling by a capacitor array and comparison by the comparator.

18. The ADC of claim 16, wherein the polarity of the samples are alternated by alternating a polarity of the analog signal prior to sampling by a capacitor array.

19. The ADC of claim 16, wherein the digital values are selectively inverted controlling a SAR register containing the un-chop switch.

20. The ADC of claim 16, wherein the digital values are selectively inverted after correction by a correction circuit.

* * * * *